United States Patent
Sampei

(10) Patent No.: US 7,223,522 B2
(45) Date of Patent: May 29, 2007

(54) PRINTING PLATE MATERIAL AND PRINTING PLATE

(75) Inventor: Takeshi Sampei, Mitaka (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 0 days.

(21) Appl. No.: 11/206,064

(22) Filed: Aug. 18, 2005

(65) Prior Publication Data

US 2006/0040207 A1 Feb. 23, 2006

(30) Foreign Application Priority Data

Aug. 23, 2004 (JP) ............................. 2004-242077

(51) Int. Cl.
G03F 7/09 (2006.01)
G03F 7/11 (2006.01)

(52) U.S. Cl. .................. 430/271.1; 430/302; 430/494; 430/944; 430/945

(58) Field of Classification Search ............ 430/270.1, 430/271.1, 302, 494, 944, 945
See application file for complete search history.

(56) References Cited

U.S. PATENT DOCUMENTS

| | | | |
|---|---|---|---|
| 5,597,671 A | 1/1997 | Dan et al. | |
| 5,968,709 A | 10/1999 | Verschueren et al. | |
| 2005/0058942 A1* | 3/2005 | Maehashi | 430/300 |
| 2005/0061183 A1* | 3/2005 | Maehashi | 101/453 |
| 2005/0221223 A1* | 10/2005 | Suzuki | 430/270.1 |
| 2005/0247223 A1* | 11/2005 | Sampei | 101/460 |
| 2006/0019196 A1* | 1/2006 | Miyoshi | 430/270.1 |

FOREIGN PATENT DOCUMENTS

| | | |
|---|---|---|
| EP | 0 546 195 A1 | 6/1993 |
| EP | 1 239 328 A2 | 9/2002 |
| EP | 1 362 709 A2 * | 11/2003 |
| EP | 1 517 176 A2 * | 3/2005 |

* cited by examiner

Primary Examiner—Barbara L. Gilliam
(74) Attorney, Agent, or Firm—Finnegan, Henderson, Farabow, Garrett & Dunner, L.L.P.

(57) ABSTRACT

It is an object of the present invention to provide that printing plate materials of the present invention exhibit excellent printing durability, less "out of color" registration, and improved printing image quality. Disclosed is a printing plate material possessing an image formation layer on one surface of a polyester support and not less than two backing layers on the other surface, wherein at least one of the backing layers is an electrically conductive layer, at least one of the backing layer is a layer containing at least one resin selected from polyester resin, acryl resin, acryl modified polyester resin and cellulose ester resin provided on the electrically conductive layer, and at least one of the backing layers contains an organic matting agent.

8 Claims, No Drawings

PRINTING PLATE MATERIAL AND PRINTING PLATE

This application claims priority from Japanese Patent Application No. Jp2004-242077 filed on Aug. 23, 2004, which is incorporated hereinto by reference.

TECHNICAL FIELD

The present invention relates to a printing plate material having a polyester support, and a printing plate using the printing plate material.

BACKGROUND

Recently, in a plate-making process of a printing plate for off-set printing, a CTP (computer to plate) system in which digital image data can be directly written in a light sensitive planographic printing plate material employing laser has been practically used. Provided are a type in which an aluminium base material is used as in the case of an existing PS plate, and a flexible type in which functional layers are formed on a film base material for printing plates, as a printing plate material used for the CTP system. A tendency toward a wide variety of printing products in small quantities has recently been observed in commercial printing, and printing plates with high quality at low price are highly demanded in the market. Known currently is a technique using a flexible type printing plate material and a printing plate developed for the market employing a plastic film sheet support which is easy to handle and carry (Refer to Patent Documents 1, 2, 3, and 4).

In the case of color printing employing a CTP printing plate material used for these plastic supports, a problem was that a printing plate with so-called high register accuracy caused "out of color registration" during printing, since four printing plates were employed in the color printing process. Another problem was that lowered printing image quality and insufficient printing durability appeared since a printing plate was deformed, and a convexoconcave structure appeared on the printing plate during printing.

(Patent Document 1) Japanese patent O.P.I. Publication No. 4-261539

(Patent Document 2) Japanese patent O.P.I. Publication No. 5-257287

(Patent Document 3) Japanese patent O.P.I. Publication No. 2000-258899

(Patent Document 4) Japanese patent O.P.I. Publication. No. 2002-79772

SUMMARY

It is an object of the present invention to provide printed matter having improved image quality of "out of color" registration, a printing plate material exhibiting excellent printing durability and a printing plate employing the printing plate-material.

BRIEF DESCRIPTION OF THE PREFERRED EMBODIMENTS

The above object of the present invention is accomplished by the following structures.

(Structure 1) A printing plate material possessing an image formation layer on one surface of a polyester support and not less than two backing layers on the other surface, wherein at least one of the backing layers is an electrically conductive layer, at least one of the backing layers is a layer containing at least one resin selected from polyester resin, acryl resin, acryl modified polyester resin and cellulose ester resin provided on the electrically conductive layer, and at least one of the backing layers contains an organic matting agent.

(Structure 2) The printing plate material of Structure 1, wherein center line average surface roughness Ra of a surface on the side of the aforesaid backing layer is 0.1–4 μm.

(Structure 3) The printing plate material of Structure 1 or 2, wherein the aforesaid polyester support has a thickness of 100–300 μm.

(Structure 4) The printing plate material of any one of Structures 1–3, wherein the aforesaid image formation layer contains either heat melting particles or heat fusible particles.

(Structure 5) The printing plate material of any one of Structures 1–4, wherein the printing plate material possesses at least one hydrophilic layer between the aforesaid polyester support and the aforesaid image formation layer.

(Structure 6) The printing plate material of any one of Structures 1–5, wherein the aforesaid hydrophilic layer has a porous structure.

(Structure 7) The printing plate material of any one of Structures 1–6, wherein the printing plate material possesses a layer containing a light-heat conversion material on the side of the aforesaid image formation layer.

(Structure 8) The printing plate material of any one of Structures 1–7, wherein the printing plate material is wound around a 4–10 cm diameter core so as to form a roll.

(Structure 9) A printing plate having an image which is prepared by that the image formation layer of the printing plate material of any one of Structures 1–7 is exposed to laser light.

While the preferred embodiments of the present invention have been described using specific terms, such description is for illustrative purposes only, and it is to be understood that changes and variations may be made without departing from the spirit or scope of the appended claims.

DETAILED DESCRIPTION OF THE INVENTION

It is a feature of the present invention that a printing plate material possesses an image formation layer on one surface of a polyester support and not less than two backing layers on the other surface, wherein at least one of the backing layers is an electrically conductive layer, a layer containing at least one resin selected from polyester resin, acryl resin, acryl modified polyester resin and cellulose ester resin provided on the electrically conductive layer is formed, and at least one of the backing layers contains an organic matting agent.

Printed matter having improved image quality of "out of color" registration and a printing plate material exhibiting excellent printing durability can be provided by forming a printing plate material backing layer arranged to be with a specific layer structure.

The backing layer of the present invention is a layer provided on the opposite side of an image formation layer, and at least one of the backing layers is an electrically conductive layer.

The electrically conductive layer is a layer having $1 \times 10^7 - 1 \times 10^{13}$ Ω in specific resistance (immediately after the printing plate material has been stored at 23° C. and 20% RH for 24 hours) of the backing layer side surface of the printing plate material.

Examples of the electrically conductive layer in the present invention include a layer containing a water-soluble salt (such as a chloride or nitrate), a vapor-deposited metal layer, water-insoluble inorganic salts described in U.S. Pat. No. 3,428,451, electrically conductive metal oxides to be described later, or electrically conductive materials such as electrically conductive polymers including ionic polymers described in U.S. Pat. Nos. 2,861,056 and 3,206,312. Preferred as electrically conductive materials in the present invention are metal oxides.

Next, metal oxides as the electrically conductive material will be to be explained. Crystalline metal oxide particles are preferred as the metal oxide. Metal oxides containing oxygen defects or metal oxides as donors containing a small amount of a hetero atom are preferred, since they generally exhibit high electroconductivity. The latter metal oxides, as donors containing a small amount of a hetero atom, are especially preferred, since they do not alter performance.

The metal oxides preferably used are $ZnO_2$, $TiO_2$, $SnO_2$, $Al_2O_3$, $In_2O_3$, $SiO_2$, $MgO$, $BaO$, $MoO_3$, $V_2O_5$, and composite metal oxides thereof, and more preferably $ZnO_2$, $TiO_2$, and $SnO_2$.

As a metal oxide containing a hetero atom, $SnO_2$ doped with Sb, or $TiO_2$ doped with Nb or Ta, is effective. The doping amount of the hetero atom is preferably 0.01–30 mol %, and more preferably 0.1–10 mol %.

The metal oxide particles used in the present invention are electrically conductive, and have a volume resistivity of preferably not more than $10^7$ Ωcm, and more preferably not more than $10^5$ Ωcm. Examples of the metal oxide include those disclosed in Japanese Patent O.P.I. Publication Nos. 56-143431, 56-120519, and 58-62647.

The metal oxides are dispersed or dissolved in a binder in the form of particles.

The binder used is not specifically limited, as long as it is capable of forming a film. The content by volume of the metal oxide in the electrically conductive layer is preferably higher in order to reduce a specific resistance of the electrically conductive layer employing the metal oxides, and also the content of the metal oxide in the electrically conductive layer is not less than 5% by weight, to provide an electrically conductive layer with sufficient strength. Therefore, the content by volume of the metal oxide in the electrically conductive layer is preferably 5–95%.

The added amount of the metal oxide in the electrically conductive layer is preferably 0.05–10 g/m$^2$, and more preferably 0.08–5 g/m$^2$.

The above added amount provides an intended anti-static property.

It is preferable in the present invention that the specific resistance (immediately after the printing plate material has been stored at 23° C. and 20% RH for 24 hours) of the backing layer side surface of the printing plate material is $1\times10^9$–$2\times10^{12}$ Ω.

Herein, the specific resistance, immediately after the printing plate material has been stored at 23° C. and 20% RH for 24 hours, is determined under the same ambience as above (at 23° C. and 20% RH), employing a specific resistance meter such as an insulation resistance meter (Teraohm Meter Model VE-30 produced by Kawaguchi Denki Co., Ltd).

[Layer Provided on Electrically Conductive Layer]

"A layer provided on an electrically conductive layer" means a layer placed farther away from the electrically conductive layer with respect to a support, and the layer contains at least one binder resin selected from polyester resin, acryl resin, acryl modified polyester resin or cellulose ester resin.

A substantively linear polyester resin obtained via a polycondensation reaction of either polybasic acid or its ester, and either polyol or its ester, may be employed as a polyester resin.

Further in the case of being used in the water-soluble form, preferably employed is a water-soluble polyester resin such as polyester and others into which an example of a component having a hydrophilic group including a sulfonate-containing component, a diethylene glycol component, a polyalkylene ether glycol component, or a polyether dicarboxylic acid component is introduced as a copolymerization component.

Sulfonate-containing dicarboxylic acid (dicarboxylic acid is hereinafter referred to as polybasic acid) is preferably employed as a component having a hydrophilic group.

Examples employed as a polyester polybasic acid component include terephthalic acid, isophthalic acid, phthalic acid, phthalic anhydride, 2,6-naphthalene dicarboxylic acid, 1,4-cyclohexane dicarboxylic acid, adipic acid, sebacic acid, trimellitic acid, pyromellitic acid, dimer acid, maleic acid, fumaric acid, itaconic acid, p-hydroxybenzoic acid, and p-(β-hydroxy ethoxy) benzoic acid. A component having sulfonic-acid alkaline metal salt is preferably used as the above sulfonate-containing dicarboxylic acid. Alkaline metal salt of 4-sulfoisophthalic acid, 5-sulfoisophthalic acid, sulfoterephthalic acid, 4-sulfophthalic acid, 4-sulfonaphthalene-2,7-dicarboxylic acid, and 5-(4-sulfophenoxy) isophthalic acid are provided as examples. Of these, 5-sulfoisophthalic acid sodium salt is especially preferred.

It is preferred from the aspect of water solubility and water resistance that the content of the dicarboxylic acid having a sulfonate is 5–15 mol %, based on the total dicarboxylic acid component, but is more preferably 6–10 mol %.

A major dicarboxylic acid component having terephthalic acid and isophthalic acid is preferably used as a water-soluble polyester resin, and it is further especially preferred, from the aspect of coatability and water solubility of a polyester support, that the content ratio of terephthalic acid and isophthalic acid is 30/70–70/30 in mol %. The content of these terephthalic acid and isophthalic acid components is preferably 50–80 mol %, based on the total dicarboxylic acid component, and it is further preferred that an alicyclic dicarboxylic acid is employed as a polymerization component.

Examples provided as the alicycle dicarboxylic acid include 1,4-cyclohexane dicarboxylic acid, 1,3-cyclohexane dicarboxylic acid, 1,2-cyclohexane dicarboxylic acid, 1,3-cyclopentane dicarboxylic acid, and 4,4'-bicyclo hexyl dicarboxylic acid. Dicarboxylic acid other than the above dicarboxylic acids can also be used as a copolymerization component for the water-soluble polyester of the present invention containing terephthalic acid and isophthalic acid as the dicarboxylic acid component.

Examples provided as the dicarboxylic acid include aromatic dicarboxylic acid and straight-chained aliphatic dicarboxylic acid. The aromatic dicarboxylic acid is preferably used in the range of not more than 30 mol %, based on the total dicarboxylic acid component. Examples provided as the aromatic dicarboxylic acid include phthalic acid, 2,5- dimethyl terephthalic acid, 2,6-naphthalene dicarboxylic acid, 1,4-naphthalene dicarboxylic acid, and biphenyl dicarboxylic acid. Straight-chained aliphatic dicarboxylic acid is preferably used in the range of not more than 15 mol %, based on the total dicarboxylic acid component. Examples provided as the straight-chained aliphatic dicarboxylic acid include adipic acid, pimelic acid, suberic acid, azelaic acid, and sebacic acid.

Examples employed also as a polyol component include ethylene glycol, diethylene glycol, 1,4-butanediol, neopentylglycol, dipropylene glycol, 1,6-hexanediol, 1,4-cyclohexanedimethanol, xylylene glycol, trimethylolpropane, poly (ethylene oxide) glycol, and poly (tetramethylene oxide) glycol.

Ethylene glycol, in the range not less than 50 mol %, is preferably used as a glycol component of the water-soluble polyester, based on the total glycol component.

The polyester resin can be synthesized, employing either dicarboxylic acid or its ester, and either glycol or its ester, as the starting raw material, for which various methods can be employed to synthesize it. An initial condensed material of dicarboxylic acid and glycol, for example, is formed by an ester exchange method or a direct esterification method, and further the polyester resin can be acquired by a commonly known manufacturing method via melt-polymerization of the initial condensation-material.

As more specific examples, provided are methods such as a method of conducting a polycondensation process under high vacuum by decreasing pressure gradually after ester exchange reaction is conducted with ester of dicarboxylic acid which is, for example, dimethylester of dicarboxylic acid, and glycol, whereby methanol is distilled, a method of conducting a polycondensation process under high vacuum by decreasing pressure gradually after esterification reaction is conducted with dicarboxylic acid and glycol, whereby produced water is distilled, and also a method of conducting a polycondensation process under high vacuum after conducting esterification reaction by adding dicarboxylic acid. A commonly known catalyst can be employed as an ester exchange catalyst or a polycondensation catalyst. Examples used as the ester exchange catalyst include manganese acetate, calcium acetate, and zinc acetate. Examples used as the polycondensation catalyst include antimony trioxide, germanium oxide, dibutyltin oxide, and titanium tetrabutoxide. Various conditions of processes and components including polymerization and catalyst, however, are not limited to the above examples.

The acryl modified polyester resin in the present invention is a resin acquired by dispersion-polymerizing acryl resin in a polyester resin solution.

The acryl modified water-soluble polyester resin is a resin acquired by dispersion-polymerizing acryl resin in a water-soluble polyester aqueous solution, whereby a dispersion liquid can be obtained via emulsion or suspension polymerization after dissolving the water-soluble polyester in hot water, and dispersing acryl resin into the resulting water-soluble polyester resin aqueous solution.

Examples as a polymerization initiator include ammonium persulfate, potassium persulfate, sodium persulfate, and benzoyl peroxide. Of these, ammonium persulfate is preferably employed. A surfactant is usable as an emulsifier to improve stability during polymerization, though polymerization may be conducted without using such surfactant. Further, either a nonion type surfactant or an anion type surfactant may be used in such case.

As acryl-containing monomers, provided, for example, are acryl resins such as alkyl acrylate or alkyl methacrylate (the alkyl group such as methyl group, ethyl group, n-propyl group, isopropyl group, n-butyl group, isobutyl, t-butyl group, 2-ethylhexyl group, cyclohexyl group, phenyl group, benzyl group, or phenylethyl group); hydroxy group-containing monomers such as 2-hydroxyethyl acrylate, 2-hydroxyethyl methacrylate, 2-hydroxypropyl acrylate, or 2-hydroxypropyl methacrylate; amide group-containing monomer such as acrylamide, methacrylamide, N-methyl methacrylamide, N-methyl acrylamide, N-methylol acrylamide, N-methylol methacrylamide, N,N-dimethylol acrylamide, N-methoxymethyl acrylamide, N-methoxymethyl methacrylamide, or N-phenyl acrylamide; amino group-containing monomers such as N,N-diethylaminoethyl acrylate, or N,N-diethyl aminoethyl methacrylate; epoxy group-containing monomers such as glycidyl acrylate, or glycidyl methacrylate; and carboxyl group or its salt-containing monomer such as acrylic acid, methacrylic acid, or its salt (such as sodium salt, potassium salt, or ammonium salt).

As monomers other than acryl-containing monomers, provided, for example, are epoxy group-containing monomers such as allyl glycidyl ether, and others; sulfonic acid group or its salt-containing monomers such as styrene sulfonic acid, vinyl sulfonic acid, and its salt (such as sodium salt, potassium salt, or ammonium salt); carboxyl group or its salt-containing monomers such as crotonic acid, itaconic acid, maleic acid, fumaric acid, and its salt (such as sodium salt, potassium salt, or ammonium salt); acid anhydride-containing monomer such as maleic anhydride, or itaconic acid anhydride; vinyl isocyanate; allyl isocyanate; styrene; vinyltris alkoxy silane; alkyl maleic acid monoester; alkyl fumaric acid monoester; acrylonirile; methacrylonitrile; alkyl itaconic acid monoester; vinylidene chloride; vinyl acetate; and vinyl chloride. Epoxy group-containing monomers such as glycidyl acrylate, and glycidyl methacrylate are preferably used as a vinyl system monomer from the aspect of coated layer strength.

It is preferable in view of acryl resin usage that the content ratio of water-soluble polymer and acryl resin is 99/1–5/95 in wt %, is more preferably 97/3–50/50 in wt %, and is still more preferably 95/5–80/20 in wt %.

The foregoing acryl resin can be used as acryl resin in the present invention.

The acryl resin in the present invention is preferably an acryl polymer latex from the group of polymer latexes in view of environmental considerations.

"Acryl polymer latex" refers to a polymer component which is dispersed in water or a water-soluble medium as water-insoluble hydrophobic polymer minute particles.

Each of dispersion states may be any of the following states: the polymer is emulsified in a dispersion medium in a dispersed state; the polymer is formed employing emulsion polymerization; the polymer is subjected to micelle dispersion; or the polymer has a partial hydrophilic structure in the molecule, and the molecular chain itself is subjected to molecular dispersion. Incidentally, examples of polymer latexes in the present invention are described in "Gosei Jushi Emulsion (Synthetic Resin Emulsion)", edited by Taira Okuda and Hiroshi Inagaki, published by Kobunshi Kankokai (1978); "Gosei Latex no Oyo (Application of Synthetic Latexes)", edited by Takaaki Sugimura, Yasuo Kataoka, Soichi Suzuki, and Keiji Kasahara, published by Kobunshi Kankokai (1993); and "Gosei Latex no Kagaku (Chemistry of Synthetic Latexes)", edited by Soichi Muroi, published by Kobunshi Kankokai (1970).

The mean particle size of acryl polymer latex dispersing particles is 1–50000 nm, and more preferably 5–1000 nm.

The particle size distribution thereof may be a polydispersed or a monodispersed distribution.

The acryl polymer latexes may be those having a uniform structure or may be core/shell type polymer latexes. In this case, the core and shell tend to be preferably used when glass transition temperature (Tg) varies.

The minimum forming (tarnishing) temperature (MFT) of the acryl polymer latexes is preferably −30 to 90° C., and more preferably 0 to 70° C.

A tarnishing aid may be added to control the MFT. The tarnishing aid is also called a plasticizer, which is an organic compound (conventionally, an organic solvent) capable of lowering the MFT of a polymer latex, and is described in "Chemistry of Synthetic Latex" (Soichi Muroi, published by KOBUNSHI-KANKOKAI, 1970).

Commonly known cellulose ester, for example, are cellulose nitrate, cellulose acetate, cellulose acetate propionate, cellulose acetate butylate, cellulose propionate, and cellulose butyrate which may be used as the cellulose ester resin. Cellulose acetate butylate and cellulose acetate propionate, however, are preferably employed.

A hydroxy group-containing cellulose ester resin can be used as the cellulose ester resin. A cellulose ester having a hydroxyl group content of 4–20% by weight can be used in combination with different kinds of resins, whereby excellent compatibility can be obtained, and adhesiveness of each interlayer can also be improved.

The above resins can be used as the admixture of one resin or not less than two resins. These resins can also be used in combination with a cross-linked resin or other resins such as amino resin, phenol resin, epoxy resin, or polyisocyanate.

One or more layers may be further provided on a layer containing at least one binder selected from polyester resin, acryl resin, acryl modified polyester resin and cellulose ester resin.

(Organic Matting Agent)

In the present invention, an organic matting agent is contained in at least one of backing layers.

It is especially preferable that the organic matting agent is contained in an outermost layer on the backing layer side.

The organic polymer matting agent composed of an organic polymer is preferably used as an organic matting agent example.

Examples of polymer used as the organic polymer matting agent include acryl resin, vinyl chloride resin, vinyl acetate resin, styrene resin, vinylidene chloride resin, acetal resin, and cellulose resin.

A layer containing an organic matting agent is preferably formed by using the resin composition in the state of being dispersed as particles with an average particle size of 0.5–20 μm, and preferably 0.1–10 μm in water or a water-soluble polymer such as gelatin or polyacrylamide.

Examples of polymer used for the organic matting agent will be listed below, but the present invention is not limited thereto.

(1) Acryl resin: polymethyl methacrylate, polyethyl methacrylate, polypropyl methacrylate, polydimethylaminoethyl methacrylate, polymethyl acrylate, polyethyl acrylate, polymethoxyethyl acrylate, etc.
(2) Acryl copolymer resin: copolymers of the monomers described in item (1) above with vinyl chloride, vinylidene chloride, vinylpyridine, styrene, acrylonitrile, acrylic acid, or methacrylic acid, etc.
(3) Vinyl chloride resin: polyvinyl chloride, copolymer of vinyl chloride with vinyl acetate, vinylidene chloride, acrylic acid, methacrylic acid, maleic acid, maleic ester, or acrylonitrile, etc.
(4) Polyvinyl acetate or its partially saponified resin
(5) Styrene resin: Polystyrene, copolymer of styrene with acrylonitrile, etc.
(6) Vinylidene chloride resin: polyvinylidene chloride, copolymer of vinylidene chloride with acrylonitrile, etc.
(7) Acetal resin: polyvinyl formal, polyvinyl butyral, etc.
(8) Cellulose: cellulose acetate, cellulose propionate, cellulose butyrate, cellulose nitrate, etc.
(9) Melamine resin: melamine-formaldehyde resin, benzoguanamie-melamine-formaldehyde resin, etc.

A dispersion of organic matting agents can be obtained according to a method in which the polymers are dissolved in an organic solvent and mixed in water or an aqueous gelatin solution with vigorous stirring, a method in which the polymer is precipitated in form of particles during emulsion polymerization, precipitation polymerization, or pearl polymerization of monomers, or a method in which the matting agent particles are dispersed in water or an aqueous gelatin solution employing a stirrer, a homogenizer, a colloid mill, a flow jet mixer or an ultrasonic dispersion device.

The organic matting agent has an average particle size of preferably 0.5–10 μm, more preferably 0.7–35 μm, and still more preferably 1–5 μm.

In the present invention, the average particle size of the organic matting agent can be obtained by calculating the diameter of a circle corresponding to the projected area in the electron microscope photograph of the organic matting agent.

The coating amount on the organic matting agent-containing layer is preferably from 0.01 to 1 g/m$^2$, and more preferably from 0.05 to 0.5 g/m$^2$.

(Center Line Average Surface Roughness Ra)

In the present invention, surface roughness Ra of the backing layer side surface is further preferably 0.1–4 μm.

Center line average surface roughness Ra (arithmetic average roughness) will be described as follows. When a roughness curve is represented by formula Y=f(X) in a roughness curve with a length L in the center line direction which is extracted from a roughness curve obtained by being measured according to a needle contact meter, the direction of the center line of the curve being set as the X-axis and the direction perpendicular to the X-axis as the Y-axis, the surface roughness Ra (μm) is represented by the following equation. (Determination of the length L and measurement of the average roughness are carried out according to JIS B 0601.)

$$Ra = \frac{1}{L}\int_0^L |f(x)|dx$$

After samples were stored at 25° C. and 65% RH for 24 hours so that the samples do not overlap with each other, center line average surface roughness Ra was measured at 25° C. and 65% RH.

Herein, as a method in which the films are not overlapped with each other, there is one in which the film at the edge portion is wound around a roll, one in which an inter leaf is inserted leaf by leaf between films, or one in which the sample sheet is put sheet by sheet on frames composed of a carton board. Examples of the surface roughness meter used in the present invention include a non-contact type three dimension microscopic surface configuration measuring system RSTPLUS produced by WYKO Co., Ltd.

(Polyester Film Support)

The polyester support in the present invention is an unstretched polyester film sheet, a uniaxially stretched polyester film sheet or a biaxially stretched polyester film sheet.

Among these, especially preferable is a longitudinally stretched polyester film sheet which is uniaxially stretched in the extruding direction of the film sheet (in the longitudinal direction).

In the case of coating a water-based liquid onto the polyester film sheet, since dust and foreign matter are easily inhaled, it is not recommended that a regular coating process, which is in relation to the biaxially stretched and heat fixed polyester film sheet, is separately conducted from the process for manufacturing the film sheet. The coating process, that is to say, a coating process in a manufacturing process of the film sheet, is preferably conducted under a clean atmosphere, and adhesiveness onto the polyester film of this adhesion layer increases based on this coating process.

Commonly known coating methods may be employed as appropriate. A roll coating method, a gravure coating method, a roll brushing method, a spray coating method, an air knife coating method, an impregnation method or a curtain coating method, as examples, can be used singly or in combination. The amount of the coated film which is transported is preferably 0.5–20 $g/m^2$, and is more preferably 1–10 $g/m^2$. It is also preferable that the water-based liquid used is an aqueous dispersion or emulsion.

The stretchable polyester film sheet coated with a water-based liquid is introduced into a drying process and a stretching treatment process. This process may be conducted under conditions which have been stored in the past by this industry. For example, the drying condition is preferably 0.90–130° C. for 2–10 minutes, and the stretching temperature is 90–130° C. The stretching ratio is 3–5 times in the longitudinal direction and also 3–5 times in the transverse direction. The re-stretching ratio is optionally 1–3 times, and the heat fixing conditions are 180–240° C. for 2–20 minutes.

It is preferable that the polyester film sheet after conducting those processes, has a thickness of 100–300 μm, and that of the adhesion layer is 0.02–1 μm.

The polyester used in the polyester film support is not specifically limited, and contains, as a main component, a dicarboxylic acid unit and a diol unit. There are, for example, polyethylene terephthalate (hereinafter also referred to as PET), and polyethylene naphthalate (hereinafter also referred to as PEN).

The polyester is preferably PET, a copolyester comprising a PET component as a main component in an amount of not less than 50% by weight, or a polymer blend containing PET in an amount of not less than 50% by weight.

PET is a polycondensate of terephthalic acid and ethylene glycol, and PEN is a polycondensate of naphthalene dicarboxylic acid and ethylene glycol. The polyester may be a polycondensate of the dicarboxylic acid and diol, constituting PET or PEN, and one or more kinds of a third component. As the third component, there is a compound capable of forming an eater.

As a dicarboxylic acid, there is, for example, terephthalic acid, isophthalic acid, phthalic acid, 2,6-naphthalene dicarboxylic acid, 2,7-naphthalene dicarboxylic acid, diphenylsulfone dicarboxylic acid, diphenylether dicarboxylic acid, diphenylthioether dicarboxylic acid, diphenylketone dicarboxylic acid, or phenylindane dicarboxylic acid, and as a glycol, there is, for example, propylene glycol, tetramethylene glycol, cyclohexanedimethanol, 2,2-bis(4-hydroxyphenyl)propane, 2,2-bis(4-hydroxyethoxyphenyl)propane, bis(4-hydroxyphenyl)sulfone, bisphenolfluorene dihydroxyethyl ether, diethylene glycol, neopentyl plycol, hydroquinone, or cyclohexane diol. The third component may be a polycarboxylic acid or a polyol, but the content of the polycarboxylic acid or polyol is preferably from 0.001 to 5% by weight based on the total weight of polyester.

The intrinsic viscosity of the polyester is preferably from 0.5 to 0.8. Polyesters having different viscosity may be used as a mixture of two or more kinds thereof.

A manufacturing method of the polyester is not specifically limited, and the polyester can be manufactured according to a commonly known polymerization method.

There can be employed a direct esterification method in which a hydroxy group of a diol is diesterified with a dicarboxylic acid via direct esterification reaction of a dicarboxylic acid component and a diol component, and the dicarboxylic acid is polymerized with a diol by heat application while distilling off the extra diol at elevated temperature under reduced pressure, or employed also is an ester exchange method in which a hydroxy group of a diol is esterified with a dicarboxylic acid via ester exchange reaction of a dialkyl ester (dimethyl ester, for example) component in place of dicarboxylic acid and a diol component, and the dicarboxylic acid is polymerized with a diol by heat application while distilling off the extra diol at elevated temperature under reduced pressure.

As catalysts, an ester exchange catalyst ordinarily used in synthesis of polyesters, a polymerization catalyst or a heat-resistant stabilizer can be used. Examples of the ester exchange catalyst include $Ca(OAc)_2.H_2O$, $Zn(OAc)_2.2H_2O$, $Mn(OAc)_2.4H_2O$, and $Mg(OAc)_2.4H_2O$. Examples of the polymerization catalyst include $Sb_2O_3$ and $GeO_2$. Examples of the heat-resistant stabilizer include Phosphoric acid, phosphorous acid, $PO(OH)(CH_3)_3$, $PO(OH)(OC_6H_5)_3$, and $P(OC_6H_5)_3$. During synthesis of polyesters, an anti-stain agent, a crystal nucleus agent, a slipping agent, an anti-blocking agent, a UV absorber, a viscosity adjusting agent, a transparentizing agent, an anti-static agent, a pH adjusting agent, a dye or pigment may be added.

(Heat Treatment of Support)

In the present invention, the polyester film sheet after stretched and heat-fixed is preferably subjected to heat treatment in order to stabilize dimension of a printing plate and minimize "out of color registration" during printing.

After the sheet has been stretched, heat fixed, cooled, wound around a spool once, and unwound, the sheet is properly heat treated at a separate process as follows.

As the heat treatment methods in the present invention, there are a transporting method in which the film sheet is transported while holding the both ends of the sheet with a pin or a clip, a transporting method in which the film sheet is roller transported employing plural transporting rollers, an air transporting method in which the sheet is transported while lifting the sheet by blowing air to the sheet (heated air is blown to one or both sides of the sheet from plural nozzles), a heating method which the sheet is heated by radiation heat from for example, an infrared heater, a heating method in which the sheet is brought into contact with plural heated rollers to heat the sheet, a transporting method in which the sheet hanging down by its own weight is wound around an up-take roller, and a combination thereof.

Tension at heat treatment can be adjusted by controlling torque of an up-take roll and/or a feed-out roll and/or by controlling load applied to the dancer roller provided in the process.

When the tension is changed during or after the heat treatment, an intended tension can be obtained by controlling load applied to the dancer roller provided in the step before, during and/or after the heat treatment. When the transporting tension is changed while vibrating the sheet, it is useful to reduce the distance between the heated rollers.

In order to reduce dimensional change on heat processing (thermal development), which is carried out later, without inhibiting thermal contraction, it is desirable to lower the transporting tension as much as possible, and lengthen the heat treatment time. The heat treatment temperature is preferably in the range of Tg+50° C.–Tg+150° C. In this temperature range, the transporting tension is preferably 5 Pa–1 MPa, more preferably 5 Pa–500 kPa, and most preferably 5 Pa–200 kPa, and the heat treatment time is preferably 30 seconds–30 minutes, and more preferably 30 seconds–15 minutes. The above described temperature range, transporting tension range and heat treatment time range can prevent the support planarity from lowering due to partial thermal contraction difference of the support occurring during heat treatment and prevent scrapes from occurring on the support due to friction between the support and transporting rollers.

It is preferred that the heat treatment is carried out at least once, in order to obtain an intended dimensional variation rate. The heat treatment can be optionally carried out not less than 2 times. The heat-treated polyester film sheet is cooled from a temperature of around Tg to room temperature and wound around a spool. During cooling to room temperature from a temperature exceeding Tg, the heat-treated polyester film sheet is preferably cooled at a rate of not less than (−) 5° C./second in order to prevent lowering of flatness of the sheet due to cooling. The heat treatment may preferably be carried out after an adhesion layer and/or a subbing layer described later in the present invention have been formed.

(Water Content of Support)

The water content of the support in the present invention is D' represented by the following formula:

$$D'(\text{weight \%}) = (w'/W') \times 100$$

wherein W' represents the weight of the support in the equilibrium state at 25° C. and 60% RH, and w' represents the weight of water contained in the support in the equilibrium state at 25° C. and 60% RH.

The water content of the support is preferably not more than 0.5% by weight, more preferably from 0.01 to 0.5% by weight, and most preferably from 0.01 to 0.3% by weight.

The water content of the support is preferably not more than 0.5% by weight, more preferably from 0.01 to 0.5% by weight, and most preferably from 0.01 to 0.3% by weight. As a method of obtaining a support having a water content of not more than 0.5% by weight, there is (1) a method in which the support is heat treated at not less than 100° C. immediately before a hydrophilic layer or another layer is coated on the support, (2) a method in which a hydrophilic layer or another layer is coated on the support under well-controlled relative humidity, and (3) a method in which the support is heat treated at not less than 100° C. immediately before a hydrophilic layer or another layer is coated on the support, covered with a moisture shielding sheet, and then uncovered. Two or more of these methods may be used in combination.

(Subbing Layer Coating on Support)

In order to increase adhesion between the polyester support and a coating layer, the surface of the support may be subjected to adhesion treatment or be coated with a subbing layer.

Examples of the adhesion treatment include corona discharge treatment, flame treatment, plasma treatment and UV light irradiation treatment.

The subbing layer is preferably a layer containing gelatin or latex.

The polyester support in the present invention is preferably a polyester film sheet, but may be a composite support in which a plate of a metal (for example, iron, stainless steel or aluminum) or a polyethylene-laminated paper sheet is laminated onto a polyester film sheet.

The composite support may be one in which the lamination is carried out before any layer is coated on the support, one in which the lamination is carried out after any layer has been coated on the support, or one in which the lamination is carried out immediately before mounted on a printing press.

(Particles)

Particles having a size of 0.01–10 μm are preferably incorporated in an amount of 1–1,000 ppm into the support, in improving handling property.

The particles may be organic or inorganic material.

Examples of the inorganic material include silica described in Swiss Patent 330158, glass powder described in French Patent 296995, and carbonate salts of alkaline earth metals, cadmium or zinc described in British Patent 1173181. Examples of the organic material include starch described in U.S. Pat. No. 2,322,037, starch derivatives described such as in Belgian Patent 625451 and British Patent 981198, polyvinyl alcohol described in Japanese Patent Examined Publication No. 44-3643, polystyrene or polymethacrylate described in Swiss Patent 330158, polyacrylonitrile described in U.S. Pat. No. 3,079,257 and polycarbonate described in U.S. Pat. No. 3,022,169. The shape of the particles may be in a regular form or irregular form.

An image formation layer is a layer capable of forming an image for being printed after imagewise exposed. The light sensitive printing plate material of the present invention is preferably a printing plate material forming an image according to an ablation type printing plate material forming an image employing a thermal laser or a thermal head, or a silver salt diffusion transfer method disclosed in Japanese Translation of PCT International Application Publication No. 8-507727 or Japanese Patent O.P.I. Publication No. 6-186750, a heat melt image layer on-press development type printing plate material or a heat fusible transfer type printing plate material disclosed in Japanese Patent O.P.I. Publication No. 9-123387.

Among these, an ablation type printing plate material, a heat melt image layer on-press development type printing plate material, a heat fusible transfer type printing plate material, or a phase change type printing plate material, each being a processless CTP printing plate material, is preferred since load to environment is reduced.

The image formation layer in the present invention preferably contains heat melting particles or heat fusible particles, and more preferably contains a water-soluble binder.

(Heat Melting Particles)

The heat melting particles used in the present invention are particularly particles having a low melt viscosity, or particles formed from materials generally classified into wax.

The materials preferably have a softening point of 40–120° C. and a melting point of 60–150° C., and more preferably a softening point of 40–100° C. and a melting point of 60–120° C. in view of storage and ink receptivity.

Materials usable include paraffin, polyolefin, polyethylene wax, microcrystalline wax, and aliphatic acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle aliphatic acid amide, parmitylamide, oleylamide, rice bran oil aliphatic acid amide, palm oil aliphatic acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable.

Among them, polyethylene, microcrystalline wax, aliphatic acid ester and aliphatic acid are preferably contained. A high sensitive image formation can be performed since these materials each have a relative low melting point and a low melt viscosity. These materials each have a lubrication ability. Accordingly, even when a shearing force is applied to the surface layer of the printing plate precursor, the layer damage is minimized, and resistance to contaminations which may be caused by scratch is further enhanced.

It is desired to distinguish an image portion from a non-image portion easily after imagewise exposed, and it is preferable to contain not less than 2 kinds of heat melting particles in order to make image visibility and printing performance after exposure compatible. Not less than 2 kinds of those heat melting particles have a different structure and/or a different average particle size.

The heat melting particles are preferably dispersible in water. The average particle size thereof is preferably from 0.01 to 10 μm, and more preferably from 0.05 to 3 μm.

The particles having an average particle size exceeding 10 μm may result in lowering of dissolving power. In the case of containing not less than 2 kinds of heat melting particles, it is preferable that the average particle size of 2 kinds of heat melting particles is not less than 0.1 μm with each other.

A nonionic surfactant, an anionic surfactant, a cationic surfactant, or a polymeric surfactant is preferably employed to disperse these heat melting particles in water. Water-dispersive heat melting particles can be stabilized by providing these compounds, and the uniform coat can be acquired with no failure.

Examples preferably provided as the nonionic surfactant include polyoxyethylene addition such as alkyl polyoxyethylene ether, alkyl polyoxyethylene, polyoxypropylene ether, aliphatic acid polyoxyethylene ester, aliphatic acid polyoxyethylene sorbitan ester, aliphatic acid polyoxyethylene sorbitol ester, polyoxyethylene, castor oil, polyoxyethylene addition of acetylene glycol, alkyl polyoxyethylene amine, or amide; polyol or alkylolamide such as aliphatic acid sorbitan ester, aliphatic acid polyglycerin ester, or aliphatic acid sucrose ester; silicon atom-containing surfactant such as polyether modified, alkyl aralkyl polyether modified, epoxy polyether modified, alcohol modified, fluorine modified, amino modified, mercapto modified, epoxy modified, or allyl modified; fluorine atom-containing surfactant of perfluoro alkyl ethyleneoxide addition; and others such as lipid-containing material, biosurfactant, or oligo soap. At least one kind of these can be used.

Examples preferably provided as the cationic surfactant include alkylamine salt or acylamine salt such as primary amine salt, acyl aminoethyl amine salt, N-alkyl polyalkylene polyamine salt, aliphatic acid polyethylene polyamide, amide, their salts, or amine salt; quaternary ammonium salt or ammonium salt having a amide bond such as alkyl trimethyl ammonium salt, dialkyl dimethyl ammonium salt, alkyl dimethylbenzyl ammonium salt, alkylpridium salt, acyl amino ethylmethyl diethyl ammonium salt, acyl amino propyl dimethylbenzyl ammonium salt, acyl amino propyl diethylhydroxyethyl ammonium salt, acyl aminoethyl pyridinium salt, or diacyl amino ethyl ammonium salt; ammonium salt having an ester bond or an ether bond such as diacyloxy ethyl methyl hydroxyethyl ammonium salt or alkyl oxymethyl pyridinium salt; imidazoline salt or imidazolium salt such as alkyl imidazoline, 1-hydroxyethyl-2-alkyl imidazoline, or 1-acyl aminoethyl-2-alkyl imidazolium salt; amine derivative such as alkyl polyoxyethylene amine, N-alkyl aminopropyl amine, N-acyl polyethylene polyamine, acyl polyethylene polyamine, or aliphatic acid triethanolamine ester; and others such as lipid-containing material, biosurfactant, or oligo soap. At least one kind of these can be used.

Examples preferably provided as the anionic surfactant include carboxylic acid salt such as aliphatic acid salt, rosin group, naphthene group, ether carboxylate, alkenyl succinate, N-acyl sarcosine salt, N-acyl glutamate, sulfuric acid primary alkyl salt, sulfuric acid secondary alkyl salt, sulfuric acid alkyl polyoxyethylene salt, sulfuric acid alkylphenyl polyoxyethylene salt, sulfuric acid mono-acyl glycerin salt, acyl amino sulfuric acid ester salt, sulfuric acid oil, or sulfation aliphatic acid alkyl ester; sulfonic acid such as α-olefin sulfonate, secondary alkane sulfonate, α-sulfo aliphatic acid, acyl isethionic acid salt, N-acyl-N-methyl taurine acid, dialkyl sulfo succinate, alkylbenzenesulfonate, alkylnaphthalenesulfonate, alkyl diphenyl ether disulfonate, petroleum sulfonate, or lignin sulfonate; phosphoric ester acid salt such as phosphoric acid alkyl-salt or phosphoric acid alkyl polyoxyethylene salt; silicon atom-containing anionic surfactant such as sulfonic acid modified or carboxyl modified; fluorine atom-containing surfactant such as perfluoro alkyl carboxylic acid salt, perfluoro alkyl sulfonic acid salt, perfluoro alkyl phosphoric acid ester, or perfluoro alkyl trimethyl ammonium salt; and others such as lipid-containing material, biosurfactant, or oligo soap. At least one kind of these can be used.

Examples preferably provided as the polymeric surfactant include polymer or copolymer of poly alkyl (meth) acrylic acid such as poly (meth) acrylate, butyl (meth) acrylate acrylic acid copolymer, ethylene-acrylic acid copolymer, or ethylene-methacrylic acid copolymer; maleic acid copolymer such as vinyl acetate-maleic anhydride copolymer, styrene-maleic anhydride copolymer, α-olefin-maleic anhydride copolymer, or diisobutylene-maleic acid copolymer; fumaric acid copolymer such as methyl (meth) acrylate-fumaric acid copolymer or vinyl acetate-fumaric acid copolymer; aromatic sulfonic-acid formalin condensation product such as naphthalene sulfonic acid formalin condensation product, butyl naphthalene sulfonic acid formalin condensation product, or cresol sulfonic-acid formalin condensation product; poly alkyl pyridinium salt (including derivatives of the copolymer obtained via copolymerization with vinyl monomer copolymerized with vinylpyridine) such as poly N-methylvinyl pyridinium chloride, or so forth; polyacrylamide, polyvinyl pyrrolidone, poly acryloyl pyrrolidone, polyvinyl alcohol, polyethylene glycol; block polymer of polyoxyethylene and polyoxypropylene; cellulose derivative such as methylcellulose or carboxymethyl cellulose; and polysaccharide derivative such as poly oxyalkylene polysiloxane copolymer, gum arabic, or arabinogalactan. At least one kind of these can be used. As for the above polymeric surfactant examples, alkali salt such as sodium, potassium, or ammonium may be allowed to be used in place of a polymeric surfactant containing a carboxyl group or a sulfone group.

The composition of the heat melting particles may be continuously varied from the interior to the surface of the particles. The particles may be covered with a different material. Known microcapsule production method or sol-gel method can be applied for covering the particles.

The heat melting particle content of the layer is preferably 1–90% by weight, and more preferably 5–80% by weight based on the total layer weight.

(Heat Fusible Particles)

The heat fusible particles in the present invention include thermoplastic hydrophobic polymer particles. Although there is no specific limitation to the upper limit of the softening point of the thermoplastic hydrophobic polymer particles, the softening point is preferably lower than the decomposition temperature of the polymer particles. The weight average molecular weight (Mw) of the polymer is preferably within the range of from 10,000 to 1,000,000.

Examples of the polymer consistituting the polymer particles include a diene (co)polymer such as polypropylene, polybutadiene, polyisoprene or an ethylene-butadiene copolymer; a synthetic rubber such as a styrene-butadiene copolymer, a methyl methacrylate-butadiene copolymer or an acrylonitrile-butadiene copolymer; a (meth)acrylate (co) polymer or a (meth)acrylic acid (co)polymer such as polymethyl methacrylate, a methyl methacrylate-(2-ethylhexyl) acrylate copolymer, a methyl methacrylate-methacrylic acid copolymer, or a methyl acrylate-(N-methylolacrylamide); polyacrylonitrile; a vinyl ester (co)polymer such as a polyvinyl acetate, a vinyl acetate-vinyl propionate copolymer and a vinyl acetate-ethylene copolymer, or a vinyl acetate-2-hexylethyl acrylate copolymer; and polyvinyl chloride, polyvinylidene chloride, polystyrene and a copolymer thereof. Among them, the (meth)acrylate polymer, the (meth)acrylic acid (co)polymer, the vinyl ester (co)polymer, the polystyrene and the synthetic rubbers are preferably used.

The polymer particles may be prepared from a polymer synthesized by any known method such as an emulsion polymerization method, a suspension polymerization method, a solution polymerization method and a gas phase polymerization method. The particles of the polymer synthesized by the solution polymerization method or the gas phase polymerization method can be produced by a method in which an organic solution of the polymer is sprayed into an inactive gas and dried, and a method in which the polymer is dissolved in a water-immiscible solvent, then the resulting solution is dispersed in water or an aqueous medium and the solvent is removed by distillation.

In both of the methods, a surfactant such as sodium lauryl sulfate, sodium dodecylbenzene sulfate or polyethylene glycol, or a water-soluble resin such as poly(vinyl alcohol) may be optionally used as a dispersing agent or stabilizing agent. Triethylamine or triethanolamine may also be contained.

The heat fusible particles are preferably dispersible in water. The average particle size of the heat fusible particles is preferably 0.01–10 µm, and more preferably 0.1–3 µm.

Further, the composition of the heat fusible particles may be continuously varied from the interior to the surface of the particles. The particles may be covered with a different material. As a covering method, known methods such as a microcapsule method and a sol-gel method are usable.

The heat fusible particle content of the layer is preferably 1–90% by weight, and more preferably 5–80% by weight based on the total weight of the layer.

Examples of the water-soluble resin used for the Image formation layer include polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone. Of these, polyacrylic acid or its salt, or polysaccharide is preferably used to prevent printing performance degradation.

It is preferred that the image formation layer in the present invention contains lower alcohol such as methanol, ethanol, isopropanol, or butanol to improve coating quality. A light-heat conversion material can also be contained in the image formation layer.

The dry coating amount of the image formation layer is preferably 0.1–1.5 g/m$^2$, and more preferably 0.15–1.0 g/m$^2$.

[Hydrophilic Layer]

In the present invention, it is preferred that the printing plate material possesses at least one hydrophilic layer between the support and the foregoing adhesion layer.

The hydrophilic layer in the present invention will be explained.

The hydrophilic layer is a layer exhibiting high repellency to ink and high affinity to water, and also a layer capable of becoming a water-holding non-image portion in the printing plate material.

In the present invention, at least one hydrophilic layer provided on the support preferably has a porous structure.

In order to form the hydrophilic layer having such a porous structure, materials described later forming a hydrophilic matrix phase are used.

Material for forming a hydrophilic matrix phase is preferably a metal oxide.

(Metal Oxide)

The metal oxide preferably comprises metal oxide particles. Examples of the metal oxide particles include particles of colloidal silica, alumina sol, titania sol and another metal oxide sol. The metal oxide particles may have any shape such as spherical, needle-like, and feather-like shape. The average particle size is preferably 3–100 nm, and plural kinds of metal oxide each having a different size may be used in combination. The surface of the particles may be subjected to surface treatment.

The metal oxide particles can be used as a binder, utilizing its layer forming ability. The metal oxide particles are suitably used in a hydrophilic layer since they minimize lowering of the hydrophilicity of the layer as compared with an organic compound binder.

(Colloidal Silica)

Among the above-mentioned, colloidal silica is particularly preferred. The colloidal silica has a high layer forming ability under a drying condition with a relative low temperature, and can provide a good layer strength. It is preferred that the colloidal silica used in the present invention is necklace-shaped colloidal silica or colloidal silica particles having an average particle size of not more than 20 nm, each being described later. Further, it is preferred that the colloidal silica provides an alkaline colloidal silica solution as a colloid solution.

The necklace-shaped colloidal silica to be used in the present invention is a generic term of an aqueous dispersion system of a spherical silica having a primary particle size of the order of nm. The necklace-shaped colloidal silica to be used in the present invention means a "pearl necklace-shaped" colloidal silica formed by connecting spherical colloidal silica particles each having a primary particle size of 10–50 nm so as to attain a length of 50–400 nm. The term of "pearl necklace-shaped" means that the image of connected colloidal silica particles is like to the shape of a pearl necklace.

The bonding between the silica particles forming the necklace-shaped colloidal silica is considered to be —Si—O—Si—, which is formed by dehydration of —SiOH groups located on the surface of the silica particles. Concrete examples of the necklace-shaped colloidal silica include Snowtex-PS series produced by Nissan Kagaku Kogyo, Co., Ltd. As the products, there are Snowtex-PS-S (the average particle size in the connected state is approximately 110 nm), Snowtex-PS-M (the average particle size in the connected state is approximately 120 nm) and Snowtex-PS-L (the average particle size in the connected state is approximately 170 nm). Acidic colloidal silicas corresponding to each of the above-mentioned are Snowtex-PS-S-O, Snowtex-PS-M-O and Snowtex-PS-L-O, respectively.

The necklace-shaped colloidal silica is preferably used in a hydrophilic layer as a porosity providing material for hydrophilic matrix phase, and porosity and strength of the layer can be secured by its addition to the layer. Among them, the use of Snowtex-PS-S, Snowtex-PS-M or Snowtex-PS-L, each being alkaline colloidal silica particles, is particularly preferable since the strength of the hydrophilic layer is increased and occurrence of background contamination is inhibited even when a lot of prints are printed.

It is known that the binding force of the colloidal silica particles is become larger with decrease of the particle size. The average particle size of the colloidal silica particles to be used in the present invention is preferably not more than 20 nm, and more preferably 3 to 15 nm.

As above-mentioned, the alkaline colloidal silica particles show the effect of inhibiting occurrence of the background contamination. Accordingly, the use of the alkaline colloidal silica particles is particularly preferable. Examples of the alkaline colloidal silica particles having the average particle size within the foregoing range include Snowtex-20 (average particle size: 10–20 nm), Snowtex-30 (average particle size: 10–20 nm), Snowtex-40 (average particle size: 10–20 nm), Snowtex-N (average particle size: 10–20 nm), Snowtex-S (average particle size: 8–11 nm) and Snowtex-XS (average particle size: 4–6 nm), each produced by Nissan Kagaku Co., Ltd.

The colloidal silica particles having an average particle size of not more than 20 nm, when used together with the necklace-shaped colloidal silica as described above, is particularly preferred, since porosity of the layer is maintained and the layer strength is further increased.

The ratio of the colloidal silica particles having an average particle size of not more than 20 nm to the necklace-shaped colloidal silica is preferably from 95/5 to 5/95, more preferably from 70/30 to 20/80, and most preferably from 60/40 to 30/70.

The hydrophilic layer of the printing plate precursor of the present invention contains porous metal oxide particles having a particle size of less than 1 μm as metal oxides.

(Porous Metal Oxide Particles)

Examples of the porous metal oxide particles include porous silica particles, porous aluminosilicate particles or zeolite particles as described later.

(Porous Silica or Porous Aluminosilicate Particles)

The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combustion of silicon tetrachloride together with hydrogen and oxygen to precipitate silica. The porosity and the particle size of such particles can be controlled by variation of the production conditions. The porous silica particles prepared from the gel by the wet method is particularly preferred.

The porous aluminosilicate particles can be prepared by the method described in, for example, JP O.P.I. No. 10-71764. Thus prepared aluminosilicate particles are amorphous complex particles synthesized by hydrolysis of aluminum alkoxide and silicon alkoxide as the major components. The particles can be synthesized so that the ratio of alumina to silica in the particles is within the range of from 1:4 to 4:1. Complex particles-composed of three or more components prepared by an addition of another metal alkoxide may also be used in the present invention. In such a particle, the porosity and the particle size can be controlled by adjustment of the production conditions.

The porosity of the particles is preferably not less than 1.0 ml/g, more preferably not less than 1.2 ml/g, and most preferably of from 1.8 to 2.5 ml/g, in terms of pore volume. The pore volume is closely related to water retention of the coated layer. As the pore volume increases, the water retention is increased, contamination is difficult to occur, and the water retention latitude is broad. Particles having a pore volume of more than 2.5 ml/g are brittle, resulting in lowering of durability of the layer containing them. Particles having a pore volume of less than 0.5 ml/g may be insufficient in printing performance.

(Measurement of Pore Volume)

Measurement of the pore volume is carried out employing AUTOSORB-1 produced by Quantachrome Co., Ltd. Assuming that the voids of particles are filled with a nitrogen gas, the pore volume is calculated from a nitrogen gas adsorption amount at a relative pressure of 0.998.

(Zeolite Particles)

Zeolite is a crystalline aluminosilicate, which is a porous material having voids of a regular three dimensional net work structure and having a pore diameter of 0.3–1 nm.

The hydrophilic matrix phase constituting the hydrophilic layer can contain layer-structural mineral particles.

Examples of the layer structural clay mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of 0.25–0.6 and bermiculite having a negative charge density of 0.6–0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

With respect to the size of the layer-structural mineral particles, the particles have an average particle size (an average of the largest particle length) of preferably less than 1 µm, and an average aspect ratio (the largest particle length/the particle thickness of preferably not less than 50, in a state contained in the layer including the case that the particles are subjected to a swelling process and a dispersing layer-separation process. When the particle size is within the foregoing range, continuity to the parallel direction, which is a trait of the layer structural particle, and softness, are given to the coated layer so that a strong dry layer in which a crack is difficult to be formed can be obtained. The coating solution containing the layer-structural clay mineral particles in a large amount can minimize particle sedimentation due to a viscosity increasing effect. The particle size greater than the foregoing may produce a non-uniform coated layer, resulting in poor layer strength. The aspect ratio lower than the foregoing reduces the planar particles, resulting in insufficient viscosity increase and reduction of particle sedimentation inhibiting effect.

The content of the layer structural clay mineral particles is preferably 0.1–30% by weight, and more preferably 1–10% by weight based on the total weight of the layer. Particularly, the addition of the swellable synthesized fluorinated mica or smectite is effective if the adding amount is small. The layer structural clay mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

An aqueous solution of a silicate is also usable as another additive to the hydrophilic matrix phase. An alkali metal silicate such as sodium silicate, potassium silicate or lithium silicate is preferable, and the $SiO_2/M_2O$ is preferably selected so that the pH value of the coating liquid after addition of the silicate exceeds 13 in order to prevent dissolution of the porous metal oxide particles or the colloidal silica particles.

An inorganic polymer or an inorganic-organic hybrid polymer prepared by a sol-gel method employing a metal alkoxide. Known methods described in S. Sakka "Application of Sol-Gel Method" or in the publications cited in the above publication can be applied to prepare the inorganic polymer or the inorganic-organic hybridpolymer by the sol-gel method.

A water-soluble resin may also be contained in the hydrophilic layer.

Examples of the water-soluble resin include polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone. In the present invention, polysaccharides are preferably used as the water-soluble resin.

As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable. These polysaccharides can form a preferred surface shape of the hydrophilic layer.

The surface of the hydrophilic layer preferably has a convexoconcave structure having a pitch of 0.1–20 µm such as the grained aluminum surface of an aluminum PS plate. The water retention ability and the image maintaining ability are raised by such a convexoconcave structure of the surface. Such a convexoconcave structure can also be formed by adding in an appropriate amount a filler having a suitable particle size to the coating liquid of the hydrophilic layer. However, the convexoconcave structure is preferably formed by coating a coating liquid for the hydrophilic layer containing the alkaline colloidal silica and the water-soluble polysaccharide so that the phase separation occurs at the time of drying the coated liquid, whereby a structure is obtained which provides a good printing performance.

The shape of the convexoconcave structure such as the pitch and the surface roughness thereof can be suitably controlled by the kinds and the adding amount of the alkaline colloidal silica particles, the kinds and the adding amount of the water-soluble polysaccharide, the kinds and the adding amount of another additive, a solid concentration of the coating liquid, a wet layer thickness or a drying condition.

It is preferred that the water-soluble resin contained in the hydrophilic matrix phase is water-soluble, and at least a part of the resin exists in the hydrophilic layer in a state capable of being dissolved in water. If a water-soluble carbon atom-containing material is cross-linked by a cross-linking agent and is insoluble in water, its hydrophilicity is lowered, resulting in problem of lowering printing performance. A cationic resin may also be contained in the hydrophilic layer. Examples of the cationic resin include a polyalkylenepolyamine such as a polyethyleneamine or polypropylenepolyamine or its derivative, an acryl resin having a tertiary amino group or a quaternary ammonium group and diacrylamine. The cationic resin may be added in a form of fine particles. Examples of such particles include the cationic microgel described in Japanese Patent O.P.I. Publication No. 6-161101.

A water-soluble surfactant may be added for improving the coating ability of the coating liquid for the hydrophilic layer in the invention. A silicon atom-containing surfactant and a fluorine atom-containing surfactant are preferably used. The silicon atom-containing surfactant is especially preferred in that it minimizes printing contamination. The content of the surfactant is preferably 0.01–3% by weight, and more preferably from 0.03 to 1% by weight based on the total weight of the hydrophilic layer (or the solid content of the coating liquid).

The hydrophilic layer in the invention can contain a phosphate. Since a coating liquid for the hydrophilic layer is preferably alkaline, the phosphate to be added to the hydrophilic layer is preferably sodium phosphate or sodium monohydrogen phosphate. The addition of the phosphate provides improved reproduction of dots at shadow portions. The content of the phosphate is preferably 0.1–5% by weight, and more preferably 0.5–2% by weight in terms of amount excluding hydrated water.

(Light-Heat Conversion Material)

The image formation layer, hydrophilic layer, hydrophilic overcoat layer or another layer in the present invention can contain a light-heat conversion material. Examples of the light-heat conversion material include the following substances:

(Infrared Absorbing Dye)

Examples of the light-heat conversion material include a general infrared absorbing dye such as a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

Examples of pigment include carbon, graphite, a metal and a metal oxide.

Furnace black and acetylene black is preferably used as the carbon. The graininess ($d_{50}$) thereof is preferably not more than 100 nm, and more preferably not more than 50 nm.

The graphite is one having a particle size of preferably not more than 0.5 µm, more preferably not more than 100 nm, and most preferably not more than 50 nm.

As the metal, any metal can be used as long as the metal is in a form of fine particles having preferably a particle size of not more than 0.5 µm, more preferably not more than 100 nm, and most preferably not more than 50 nm. The metal may have any shape such as spherical, flaky and needle-like. Colloidal metal particles such as those of silver or gold are particularly preferred.

As the metal oxide, materials having black color in the visible regions, or electro-conductive materials or semi-conductive materials can be used. Examples of the materials having black color in the visible regions include black iron oxide ($Fe_3O_4$), and black complex metal oxides containing at least two metals. Black complex metal oxides comprised of at least two metals are preferred. Typically, the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441. The complex metal oxide used in the invention is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light-heat conversion efficiency as compared with another metal oxide. The primary average particle size of these complex metal oxides is preferably not more than 1 µm, and more preferably 0.01–0.5 µm. The primary average particle size of not more than 1 µm improves a light-heat conversion efficiency relative to the addition amount of the particles, and the primary average particle size of 0.01–0.5 µm further improves a light-heat conversion efficiency relative to the addition amount of the particles. The light-heat conversion efficiency relative to the addition amount of the particles depends on a dispersity of the particles, and the well-dispersed particles have a high light-heat conversion efficiency. Accordingly, these complex metal oxide particles are preferably dispersed according to a known dispersing method, separately to a dispersion liquid (paste), before being added to a coating liquid for the particle containing layer. The metal oxides having a primary average particle size of less than 0.01 are not preferred since they are difficult to disperse. A dispersant is optionally used for dispersion. The addition amount of the dispersant is preferably 0.01–5% by weight, and more preferably 0.1–2% by weight, based on the weight of the complex metal oxide particles. Kinds of the dispersant are not specifically limited, but the dispersant is preferably a silicon-contained surfactant.

Examples of the electro-conductive materials or semi-conductive materials include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3 \cdot 2B_2O$ and $K_2O \cdot nTiO_2$ with these metal oxides is usable. The particle size of these particles is preferably not more than 0.5 µm, more preferably not more than 100 nm, and most preferably not more than 50 nm.

The especially preferred light-heat conversion materials are the above-described infrared absorbing dyes or the black complex metal oxides comprised of at least two metal oxides.

The addition amount of the light-heat conversion materials is preferably 0.1–50% by weight, more preferably 1–30% by weight, and most preferably 3–25% by weight based on the weight of the layer to which the material are added.

(Hydrophilic Overcoat Layer)

In the present invention, a hydrophilic overcoat layer is preferably provided on the image formation layer, in order to prevent flaws from occurring during handling.

The hydrophilic overcoat layer may be provided directly or through an intermediate layer on the image formation layer. It is preferred that the hydrophilic overcoat layer can be removed on a printing press.

Examples of the water soluble resin include polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone. In the invention, polysaccharides are preferably used as the water soluble resin. As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable.

In the present invention, the hydrophilic overcoat layer can contains a light-heat conversion material described before.

The overcoat layer in the present invention preferably contains a matting agent with an average size of 1–20 µm, in order to prevent flaws from occurring while the printing plate material is mounted on a laser apparatus or on a printing press.

The matting agent is preferably inorganic particles having a new Mohs hardness of not less than 5 or an organic matting agent. Examples of the inorganic particles having a new Mohs hardness of not less than 5 include particles of metal oxides (for example, silica, alumina, titania, zirconia, iron oxides, chromium oxide), particles of metal carbides (for example, silicon carbide), boron nitride particles, and diamond particles.

Examples of the organic matting agent include starch described in U.S. Pat. No. 2,322,037, starch derivatives described in BE 625,451 and GB 981,198, Polyvinyl alcohol described in Japanese Patent Examined Publication No. 44-3643, polystyrene or polymethacrylate described in CH 330,158, polyacrylonitrile described in U.S. Pat. No. 3,079,257, and polycarbonate described in U.S. Pat. No. 3,022,169.

The adding amount of the matting agent in the overcoat layer is preferably from 0.1 g to less than 10 g per $m^2$.

A coating solution for the overcoat layer may contain a nonionic surfactant in order to secure uniform coatability of the overcoat layer. Examples of the nonionic surfactant include sorbitan tristearate, sorbitan monopalmitate, sorbitan trioleate, stearic acid monoglyceride, polyoxyethylenenonylphenyl ether, and polyoxyethylenedodecyl ether. The content of the nonionic surfactant is preferably 0.05 to 5% by weight, and more preferably 1 to 3% by weight based on the total solid content of the overcoat layer.

The dry thickness of the overcoat layer is preferably 0.05 to 1.5 $g/m^2$, and more preferably 0.1 to 0.7 $g/m^2$. This content range prevents occurrence of staining or scratches or deposition of fingerprints, and minimizes ablation scum without impairing removability of the overcoat layer.

(Visibility)

Before a printing plate with an image is mounted on a printing press for printing, there is usually a plate inspection process for examining if the image is correctly formed on the printing plate.

When the plate inspection process is carried out, it is preferred that a printing plate before printing has a property in which an image formed on the printing plate is visible, that is, image visibility.

Since the printing plate material of the invention is a processless printing plate material capable of carrying out printing without special development, it is preferred that the optical density of exposed portions in the printing plate material varies by light or heat generated on exposure.

As a method for providing image visibility to a printing plate material in the invention, there is a method employing a cyanine type infrared light absorbing dye, which varies its optical density on exposure, a method employing a combination of a photo-induced acid generating agent and a compound varying its color by an acid, a method employing a combination of a color forming agent such as a leuco dye and a color developing agent, or a method employing a function in which the foregoing devitrified and milky-white heat melting particles or heat fusible particles before exposure of light are trasparentized by exposure.

(Packaging Material)

The printing plate material manufactured above was cut into an intended size, packed in a packaging material and stored till the material is subjected to exposure for image formation as described later.

It is preferred that the printing plate material is wound around a core having a diameter of 4–10 cm so as to form a printing plate material roll. In order to endure a long term storage, the packaging material is preferably one having an oxygen permeability of not more than $5\times10^{-6}$ ml/Pa·$m^2$·30° C.·day as disclosed in Japanese Patent O.P.I. Publication No. 2000-206653.

As another embodiment, the packaging material is also preferred which has a moisture permeability of not more than $10^{-6}$ g/Pa·$m^2$·25° C.·day as disclosed in Japanese Patent O.P.I. Publication No. 2000-206653.

(Exposure)

The image formation on the printing plate material of the present invention is obtained preferably by laser, and the printing plate is prepared via the printing plate material imagewise exposed to laser light.

The laser can emit light having a wavelength of infrared and/or near-infrared regions, that is, a wavelength of 700–1500 nm.

As the laser, a gas laser can be used, but a semi-conductor laser, which emits light having a near-infrared region wavelength, is preferably used.

A device suitable for the scanning exposure in the invention may be any device capable of forming an image on the printing plate material according to image signals from a computer employing a semi-conductor laser.

Generally, the following scanning exposure processes are mentioned.

(1) A process in which a plate precursor provided on a fixed horizontal plate is scanning exposed in two dimensions, employing one or several laser beams.

(2) A process in which the surface of a plate precursor provided along the inner peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

(3) A process in which the surface of a plate precursor provided along the outer peripheral wall of a fixed cylinder is subjected to scanning exposure in the rotational direction (in the main scanning direction) of the cylinder, employing one or several lasers located inside the cylinder, moving the lasers in the normal direction (in the sub-scanning direction) to the rotational direction of the cylinder.

In the present invention, the process (3) above is preferable, and especially preferable when a printing plate material mounted on a plate cylinder of a printing press is scanning exposed.

Employing the thus printing plate material after image recording, printing is carried out without a special development process. After the printing plate material is imagewise exposed and mounted on a plate cylinder of a printing press, or after the printing plate material is mounted on the cylinder and then imagewise heated to obtain a printing plate material, a dampening water supply roller and/or an ink supply roller are brought into contact with the surface of the resulting printing plate material while rotating the plate cylinder to remove non-image portions of the component layer of the printing plate material (so-called, development on press).

The removal of non-image portions of the image formation layer can be carried out in the same sequences as in conventional PS plates. A so-called development process on press is also desired to be preferably conducted.

It is preferred that the printing method in this case has had a step of drying the surface of a printing plate material, before a dampening water supply roller or an ink supply roller is brought into contact with the surface of the printing plate material.

EXAMPLE

The present invention will be detailed employing the following examples, but the invention is not limited thereto. Incidentally, parts represent parts by weight, unless otherwise noted.

Example 1

<Preparation of Polyester Support>

(Preparation of Support 1)

Employing terephthalic acid and ethylene glycol, polyethylene terephthalate having an intrinsic viscosity VI of 0.66 (at 25° C. in a phenol/tetrachloroethane (6/4 by weight) solvent) was prepared according to a conventional method.

The resulting polyethylene terephthalate was formed into pellets, dried at 130° C. for 4 hours, and melted at 300° C. The melted polyethylene terephthalate was extruded from a T-shaped die onto a 50° C. drum, and rapidly cooled. Thus, an unstretched film sheet having an average thickness of 175 μm was obtained.

The film sheet was stretched in the mechanical direction at 102° C. by a stretching magnification of 1.3, and then at 110° C. by a stretching magnification of 2.6. Successively, the stretched film sheet was further stretched at 120° C. by a stretching magnification of 4.5 in the transverse direction in a tenter. The resulting sheet was heat fixed at 240° C. for 20 seconds and relaxed at 240° C. in the transverse direction by 4%.

Thereafter, the sheet at the chuck portions in the tenter was cut off, and the both edges of the sheet were subjected to knurling treatment. The knurled sheet was cooled to 40° C., and wound around an up-take spool at a tension of 47.1 N/m. Thus, a biaxially stretched polyethylene terephthalate film sheet (support 1) was prepared.

This polyethylene terephthalate film sheet had a glass transition temperature (Tg) of 79° C. The width of the polyethylene terephthalate film sheet had a width of 2.5 m. The thickness distribution of the resulting support 1 was 3%.

<Preparation of Subbed Base Material>

One surface of the resulting support 1 prepared above was subjected to corona discharge treatment at 0.05 kV·A·min/m². The following <subbing layer coating solution (backing layer coating solution) c-1> or <subbing layer coating solution (backing layer coating solution) c-2> was coated on one side of the surface to be with a dry thickness of 0.06 μm and dried at 140° C. Subsequently, the following <subbing layer coating solution (backing layer coating solution) d-1> or <subbing layer coating solution (backing layer coating solution) d-2> was coated on one side of the surface to be with a dry thickness of 0.2 μm, and dried at 140° C. (subbing layer surface B).

<<Subbing Layer Coating Solution (Backing Layer Coating Solution) c-1: Electrically Conductive Layer Based on the Present Invention>>

| | |
|---|---|
| Latex of styrene/glycidyl methacrylate/ butyl acrylate (20/40/40) copolymer (30% in terms of solid content) | 16.0 g |
| Latex of styrene/butyl acrylate/ hydroxymethyl methacrylate (25/45/30) copolymer (30% in terms of solid content) | 4.0 g |
| SnO₂ sol (10% in terms of solid content) | 9.1 g |
| (synthesized by the method described in Japanese Patent O.P.I. publication No. 10-059720) Anionic surfactant S-1 | 0.5 g |

Distilled water was added to make a coating solution of 1000 ml.

<<Subbing Layer Coating Solution (Backing Layer Coating Solution) c-2>>

| | |
|---|---|
| Latex of styrene/glycidyl methacrylate/ butyl acrylate (20/40/40) copolymer (30% in terms of solid content) | 20.0 g |
| Latex of styrene/butyl acrylate/ hydroxymethyl methacrylate (25/45/30) copolymer (30% in terms of solid, content) | 9.0 g |
| Anionic surfactant S-1 | 0.5 g or more |

Distilled water was added to make a coating solution of 1000 ml.

<<Subbing Layer Coating Solution (Backing Layer Coating Solution) d-1: Resin-Containing Layer Based on the Present Invention>>

| | |
|---|---|
| Modified water-soluble polyester A (See below. 18% in terms of solid content) | 215.0 g |
| Anionic surfactant S-1 | 0.4 g |
| Spherical silica SEAHOSTAR KE-P50 (produced by Nippon Shokubai Co., Ltd.) | 0.3 g |

Distilled water was added to make a coating solution of 1000 ml (0.5% in terms of solid content).

<<Water-Soluble Copolyester A>>

Aqueous-Dispersed Substance of Water-Soluble Copolyester Component/Acryl Component (80/20)

The water-soluble copolyester component is an admixture component of terephthalic acid/isophthalic acid/cyclohexane dicarboxylic acid/5-sulfo-isophthalic acid dimethylsodium salt (40/38/14/8) and ethylene glycol. The acryl component is latex of methyl methacrylate/ethyl acrylate/glycidyl methacrylate (53/37/10) copolymer.

<<Subbing Layer Coating Solution (Backing Layer Coating Solution) d-2>>

| | |
|---|---|
| Gelatin | 38.7 g |
| Anionic surfactant S-1 | 0.4 g |
| Spherical silica SEAHOSTAR KE-P50 (produced by Nippon Shokubai Co., Ltd.) | 0.3 g |

Distilled water was added to make a coating solution of 1000 ml.

The surface on the opposite side was subsequently subjected to corona discharge treatment with 0.05 kV·A·min/m², and the following <<subbing layer coating solution a>> was coated to give the layer with a dry thickness of 0.25 μm. Next, after the following <<subbing layer coating solution b>> was coated to give the layer with a dry thickness of 0.06 μm, a drying process was carried out at 140° C. (subbing layer surface A).

These were subjected to heat treatment at 125° C. for 2 minutes to prepare subbed support samples.

<<Subbing Layer Coating Solution a>>

| | |
|---|---|
| Latex of styrene/glycidyl methacrylate/butyl acrylate (20/40/40) copolymer (30% in terms of solid content) | 56.3 g |
| Latex of styrene/glycidyl methacrylate/butyl acrylate (59.7/39.8/0.5) copolymer (30% in terms of solid content) | 210 g |
| Anionic surfactant S-1 (2% aqueous solution) | 30 g |

Distilled water was added to make coating solution a of 1000 ml.

<<Subbing Layer Coating Solution b>>

| | |
|---|---|
| Modified polyester B (See below. 21.7% in terms of solid content) | 31 g |
| Anionic surfactant S-1 | 5.7 g |
| Spherical silica matting agent SEAHOSTAR KE-P50 (produced by Nippon Shokubai Co., Ltd.) | 1.9 g |
| Aqueous solution in which F-1 of 250 ppm was added into ethylene copolymer polyvinyl alcohol (RS2117 produced by Kuraray Co., Ltd.) (5% in terms of solid content) | 57.7 g |
| Hardener H-1(0.5% solid content aqueous solution) | 50 g |

Distilled water was added to make subbing layer coating solution b of 1000 ml.

<<Modified Water-Soluble Polyester B>>

Aqueous-Dispersed Substance of Water-Soluble Copolyester Component/Acryl Component (64/36)

The water-soluble copolyester component is an admixture component of terephthalic acid/isophthalic acid/cyclohexane dicarboxylic acid/5-sulfo-isophthalic acid dimethylsodium salt (40/38/14/8) and ethylene glycol. The acryl component is latex of styrene/glycidyl methacrylate/butyl acrylate/aceto acetoxyethyl metacrylate (39.5/40/20/0.5) copolymer.

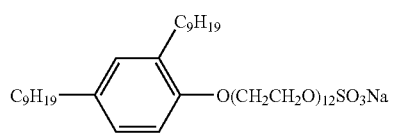

S-1

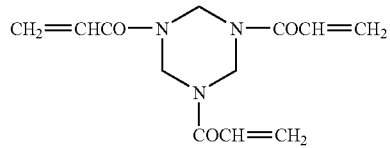

H-1

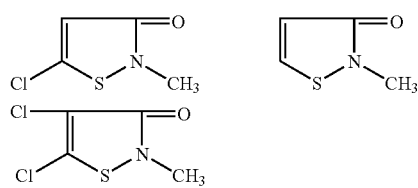

F-1

(Component A) (Component B) (Component C) Component A:Component B:Component C=50:46:4 (by mole)

<<Heat Treatment of Support>>

The support was slit to obtain a width of 1.25 m, and subjected to heat treatment (low tension heat treatment) at a tension of 2 hPa at 180° C. for one minute.

<<Preparation of Printing Plate Material>>

The subbed support was dried at 100° C. for 30 seconds immediately before coating a hydrophilic layer, and covered with a moisture proof sheet so as not to contact moisture in air to obtain a covered support. The moisture content of the support was measured to be 0.2%. The covered support, immediately after uncovered, was coated with a hydrophilic layer.

Hydrophilic layer 1 coating solution shown in Table 1 (the preparation method will be described later) and hydrophilic layer 2 coating solution shown in Table 2 (the preparation method will be described later) were coated on subbing surface A of the subbed support with a wire bar. Hydrophilic layer 1 coating solution and Hydrophilic layer 2 coating solution were coated on the subbed support in the order of hydrophilic layer 1 to hydrophilic layer 2, and they were dried at 120° C. for 3 minutes, and further heat treated at 60° C. for 48 hours.

Thereafter, the image formation layer coating solution shown in Table 3 was coated with a wire bar on the resulting hydrophilic layer, and the outermost backing layer coating solution in Table 4 (the preparation method will be described later) was coated on subbing surface B of the subbed support with a wire bar. They were dried at 50° C. for 3 minutes. Incidentally, Ra of the surface on the back surface side of printing plate material 106 in the present invention was measured to be 1.6 μm.

Each printing plate material was subsequently subjected to seasoning treatment at 50° C. for 48 hours.

[Preparation of Hydrophilic Layer 1 Coating Solution]

The materials as shown in Table 1 were sufficiently mixed in the amounts shown in Table 1 while stirring, employing a homogenizer, and filtered, diluted with pure water and dispersed to obtain hydrophilic layer 1 coating solution. In Table 1, numerical values represent solid content by weight per m$^2$.

TABLE 1

| Materials | 1—1 |
|---|---|
| Colloidal silica (alkali type): Snowtex XS (solid 20% by weight, produced by Nissan Kagaku Co., Ltd.) | 1.2 g |
| Colloidal silica (alkali type): Snowtex ZL (solid 40% by weight, produced by Nissan Kagaku Co., Ltd.) | 80 mg |
| STM-6500S produced by Nissan Kagaku Co., Ltd. (spherical particles comprised of melamine resin as cores and silica as shells with an average particle size of 6.5 μm and having a convexoconcave surface) | 0.4 g |
| Cu-Fe-Mn type metal oxide black pigment: TM-3550 black aqueous-dispersed substance {prepared by dispersing TM-3550 black powder having a particle size of about 0.1 μm produced by Dainichi Seika Kogyo Co., Ltd. in water to give a solid content of 40% by weight (including 0.2% by weight of dispersant)} | 0.5 g |
| Layer structural clay mineral particles: Montmorillonite Mineral Colloid MO gel prepared by vigorously stirring montmorillonite Mineral Colloid MO; gel produced by Southern Clay Products Co., Ltd. (average particle size: 0.1 μm) in water in a homogenizer to give a solid content of 5% by weight | 30 mg |
| Aqueous 4% by weight sodium carboxymethyl cellulose solution (Reagent produced by Kanto Kagaku Co., Ltd.) | 10 mg |

TABLE 1-continued

| Materials | 1—1 |
|---|---|
| Aqueous 10% by weight sodium phosphate·dodecahydrate solution (Reagent produced by Kanto Kagaku Co., Ltd.) | 6 mg |
| Porous metal oxide particles Silton JC 40 (porous aluminosilicate particles having an average particle size of 4 μm, produced by Mizusawa Kagaku Co., Ltd.) | 0.3 mg |
| Silicone surfactant: FZ2161 (Nippon Unicar Co., Ltd.) | 50 mg |

[Preparation of Hydrophilic Layer 2 Coating Solution]

The materials as shown in Table 2 were sufficiently mixed in the amounts shown in Table 2 while stirring, employing a homogenizer, and filtered, diluted with pure water and dispersed to obtain hydrophilic layer 2 coating solution. In Table 2, numerical values represent solid content by weight per m².

TABLE 2

| Materials | 1—1 |
|---|---|
| Colloidal silica (alkali type): Snowtex XS (solid 20% by weight, produced by Nissan Kagaku Co., Ltd.) | 1.2 g |
| Colloidal silica (alkali type): Snowtex ZL (solid 40% by weight, produced by Nissan Kagaku Co., Ltd.) | 80 mg |
| STM-6500S produced by Nissan Kagaku Co., Ltd. (spherical particles comprised of melamine resin as cores and silica as shells with an average particle size of 6.5 μm and having a convexoconcave surface) | 0.4 g |
| Cu-Fe-Mn type metal oxide black pigment: TM-3550 black aqueous-dispersed substance {prepared by dispersing TM-3550 black powder having an a particle size of about 0.1 μm produced by Dainichi Seika Kogyo Co., Ltd. in water to give a solid content of 40% by weight (including 0.2% by weight of dispersant)} | 0.5 g |
| Layer structural clay mineral particles: Montmorillonite Mineral Colloid MO gel prepared by vigorously stirring montmorillonite Mineral Colloid MO; gel produced by Southern Clay Products Co., Ltd. (average particle size: 0.1 μm) in water in a homogenizer to give a solid content of 5% by weight | 30 mg |
| Aqueous 4% by weight sodium carboxymethyl cellulose solution (Reagent produced by Kanto Kagaku Co., Ltd.) | 10 mg |
| Aqueous 10% by weight sodium phosphate·dodecahydrate solution (Reagent produced by Kanto Kagaku Co., Ltd.) | 6 mg |
| Porous metal oxide particles Silton JC-40 (porous aluminosilicate particles having an average particle size of 4 μm, produced by Mizusawa Kagaku Co., Ltd.) | 0.3 g |
| Hydroxyether modified starch (PENON JE66 produced by Nippon Starch Chemical Co., Ltd.) | 10 mg |
| Silicone surfactant: FZ2161 (Nippon Unicar Co., Ltd.) | 50 mg |

[Preparation of Image Formation Layer Coating Solution]

The materials for the image formation layer coating solution which was prepared via dilution with pure water and aqueous dispersion, are shown in Table 3. In Table 3, numerical values represent solid content by weight per m².

TABLE 3

| Materials | |
|---|---|
| Dispersion liquid prepared by diluting with pure water carnauba wax emulsion A118 (having a solid content of 40% by weight, the wax having an average particle size of 0.25 μm, a melting viscosity at 140° C. of 8 cps, a softening point of 65° C., and a melting point of 80° C., produced by GifuCerac Co., Ltd.) to give a solid content of 5% by weight | 400 mg |
| microcrystalline wax emulsion A206 (having a solid content of 40% by weight and the wax having an average particle size of 0.6 μm, produced by | 150 mg |

TABLE 3-continued

| Materials | |
|---|---|
| GifuCerac Co., Ltd.) to give a solid content of 5% by weight | |
| Trehalose (disaccharide) solution (Treha, melting point of 97° C., produced by Hayashihara Shoji Co., Ltd., having a solid content of 10% by weight) | 20 mg |
| Propanol | 80 mg |
| 2,4,7,9-tetramethyl-5-decyne-4,7-dipolyoxyethelene-ether (SURFYNOL 465 produced by Air Products Japan, Inc.) | 5 mg |
| Hydroxyether modified starch (PENON JE66 produced by Nippon Starch Chemical Co., Ltd.) | 15 mg |
| Infrared dye 1 | 5 mg |
| Water-soluble resin of sodium polyacrylate: AQUALIC DL522 (average molecular weight of 170,000 and solid content 30.5%, produced by Nippon Shokubai Co., Ltd.) | 45 mg |

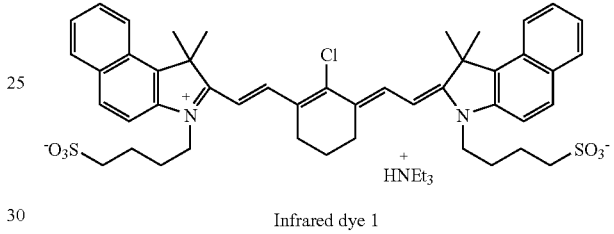

Infrared dye 1

[Preparation of Outermost Backing Layer Coating Solution]

The materials as shown in Table 4 were sufficiently mixed in the amounts shown in Table 4 while stirring, employing a homogenizer, and filtered, diluted with pure water and dispersed to the outermost backing layer coating solution. In Table 4, numerical values represent solid content by weight per m².

TABLE 4

| Materials | Outermost backing layer treatment 1 | Outermost backing layer treatment 2 |
|---|---|---|
| Colloidal silica (alkali type): Snowtex XS (solid 20% by weight, produced by Nissan Kagaku Co., Ltd.) | 0.7 g | 0.7 g |
| Organic polymer matting agent made of polymethylmethacrylate resin (spherical form; average particle size of 5.5 μm) | 0.06 g | — |
| Silica matting agent (irregular form; average particle size of 1.5 μm) | — | 0.06 g |
| Polyvinyl alcohol: PVA117 produced by Kuraray Co., Ltd. (10% by weight aqueous solution) | 0.01 g | 0.01 g |
| Acryl emulsion: AE986A (solid 35% by weight) | 0.6 g | 0.6 g |
| SURFYNOL 465 produced by Air Products Japan, Inc. (surfactant in which ethylene oxide E is added into acetylene diol) | 0.01 g | 0.01 g |

<<Preparation of Printing Plate Sample>>

The resulting printing plate material was cut into a size of 73 cm (width)×32 m (length), and wound around a spool made of cardboard having a diameter of 7.5 cm. Thus, a printing plate sample in roll form was prepared. The resulting printing plate sample was wrapped in a 150 cm×2 m package made of Al$_2$O$_3$PET (12 μm)/Ny (15 μm)/CPP (70 μm).

The resulting wrapped material was stored at 50° C. and 60% RH for seven days. The package had an oxygen permeation of 1.7×10$^{-5}$ ml/Pa·m$^2$·30° C.·day, and a moisture permeability of 1.8×10$^{-5}$ g/Pa·m$^2$·25° C.·day.

Incidentally, specific resistance of printing plate material 106 after coating measured by the following method was 1×10$^{11}$ Ω.

<<Evaluation of Printing Plate Sample>>

(a) Image Formation Employing Infrared Laser

The resulting printing plate sample was imagewise exposed by an infrared laser exposure apparatus having a punch block for printing.

Exposure was carried out employing an infrared laser (having a wavelength of 830 nm and a laser beam spot diameter of 18 μm) at a resolution of 2,400 dpi to form an image with a screen number of 175 lines. In the exposure, the exposure energy on the image formation layer surface was varied from 150 to 350 mJ/cm$^2$ at an interval of 50 mJ/cm$^2$. (The term, "dpi" shows the number of dots per 2.54 cm.) Thus, an exposed printing plate sample with an image was obtained.

Pinholes for printing are in advance produced in the resulting printing plate sample.

(b) Evaluation as Printing Plate

<<Printing Method>>

The printing plate sample imagewise exposed was set to a printing press, a dampening water 1.5% aqueous solution and ink (Soybean type TK Hyeco SOY1 Magenta, produced by TOYO INK MANUFACTURING Co.) were employed, and printing was carried out on coated paper sheets till when 10,000 copies were printed while spraying powder (Nikkalyco Mini-Pack M; starch having an average particle size of about 20 μm, produced by Nikka Ltd.).

Printing was carried out in the same manner as in printing sequence carried out for a conventional PS plate, except that development employing a special developer was not carried out. Layers at non-image portions of the inventive printing plate samples were eliminated, when the surface of the sample was observed.

<<"Out of Color" Registration Evaluation>>

The exposed sample was scratched to form two grooves with a width of 50 μm, one being 50 cm distant from the other. Printing was carried out employing the sample, the distance between the two grooves on the one hundredth printed sheet and thirty thousandth printed sheet was observed, and evaluated as a measure of "out of color" registration. The less the difference is the better.

<<Evaluation of Dot Printing Image Quality>>

Printing was carried out for 5000 copies. 2% dot image quality was visually observed in the 5000$^{th}$ copy, employing a 100 power magnifier to evaluate the quality, introducing rankings. Ranking 5 indicates high-quality dot with no fringe, and less than ranking 3 indicates totally off from practical use, though the ranking drops simply with lowering the quality.

<<Evaluation of Printing Durability>>

The printing plate sample imagewise exposed was set to a printing press again, a dampening water 1.5% aqueous solution and ink (Soybean type TK Hyeco SOY1 Indigo, produced by TOYO INK MANUFACTURING Co.) were employed, and printing was carried out on the reverse side of the foregoing printed 10,000 copies while spraying powder of Nikkalyco Mini-Pack M.

Printing durability was expressed in terms of the number of paper sheets printed from when printing started till when a 3% dot image lacked not less than 50% of the dots was counted. The more the number is, the higher the printing durability.

(Dampening Solution)

| | |
|---|---|
| propylene glycolmono-n-butylether | 50 g |
| 1,2-propanediol | 25 g |
| 3,6-dimethyl-4-hexylacetylene-3,6-diol | 5 g |
| glycerin | 5 g |
| ammonium nitrate | 2 g |
| calboxymethyl cellulose | 1 g |
| primary ammonium phosphate | 1 g |
| secondary ammonium phosphate | 1 g |
| sodium acetate | 1 g |
| 2,3-bromo-2-nitroethanol | 0.2 g |
| 2-methyl-5-chloro-4-isothiazolyne-3-one | 0.2 g |

Water is added to make 1 liter.

The results obtained are shown in Table 5.

TABLE 5

| Printing plate material | subbing lower layer on the subbing surface B side | subbing upper layer on the subbing surface B side | Outermost backing layer treatment | outof-color registration (μm) | Dot printing image quality (Ranking) | Printing durability (number) | Remarks |
|---|---|---|---|---|---|---|---|
| 101 | c-1 | d-2 | 2 | 200 | 1 | 2000 | Comparative example |
| 102 | c-2 | d-1 | 2 | 400 | 1 | 2000 | Comparative example |
| 103 | c-1 | d-1 | 2 | 300 | 1 | 2000 | Comparative example |
| 104 | c-2 | d-1 | 1 | 200 | 2 | 4000 | Comparative example |

TABLE 5-continued

| Printing plate material | subbing lower layer on the subbing surface B side | subbing upper layer on the subbing surface B side | Outermost backing layer treatment | outof-color registration (μm) | Dot printing image quality (Ranking) | Printing durability (number) | Remarks |
|---|---|---|---|---|---|---|---|
| 105 | c-1 | d-2 | 1 | 200 | 2 | 3000 | Comparative example |
| 106 | c-1 | d-1 | 1 | 50 | 5 | 10000 | Present invention |

It is to be understood via Table 5 that printing plate materials of the present invention exhibit excellent printing durability, less "out of color" registration, and improved printing image quality.

Example 2

Printing plate material 107 was prepared, similarly to printing plate material 106 of EXAMPLE 1, except that modified water-soluble polyester A of subbing layer coating solution d-1 in EXAMPLE 1 was replaced to polyester resin (VILONAL MD-1400, produced by Toyo Boseki Co., Ltd.). Printing plate material 108 was prepared, similarly to printing plate material 106 of EXAMPLE 1, except that modified water-soluble polyester A of subbing layer coating solution d-1 in EXAMPLE 1 was replaced to acryl resin (JULIMER-AC-10S, produced by Nippon Junyaku Co., Ltd.). Printing plate material 109 was prepared, similarly to printing plate material 106 of EXAMPLE 1, except that modified water-soluble polyester A of subbing layer coating solution d-1 in EXAMPLE 1 was replaced to cellulose ester resin (CAB-381-20, produced by Eastman Chemical Ltd.).

Printing plate materials 107, 108 and 109 had the same results as printing plate material 106, when the same evaluation as EXAMPLE 1 was carried out.

[Effect of the Invention]

Provided can be printed matter having improved image quality of "out of color" registration, a printing plate material exhibiting excellent printing durability and a printing plate employing the printing plate material via the aforesaid structures.

What is claimed is:

1. A printing plate material comprising an image formation layer on one surface of a polyester support and not less than two backing layers on the other surface, wherein at least one of the backing layers is an electrically conductive layer, a least one of the backing layers is a layer containing at least one resin selected from polyester resin, acryl resin, acryl modified polyester resin and cellulose ester resin providing on the electrically conductive layer, and at least one of the backing layers contains an organic matting agent.

2. The printing plate material of claim 1, wherein the center line average surface roughness Ra of a surface of the outermost backing layer is 0.1–4 μm.

3. The printing plate material of claim 1,
wherein the polyester support has a thickness of 100–300 μm.

4. The printing plate material of claim 1,
wherein the image formation layer contains either heat melting particles or heat fusible particles.

5. The printing plate material of claim 1,
wherein the printing plate material comprises at least one hydrophilic layer between the polyester support and the image formation layer.

6. The printing plate material of claim 5,
wherein the at least one hydrophilic layer has a porous structure.

7. The printing plate material of claim 1,
wherein the printing plate material is wound around a 4–10 cm diameter core so as to form a roll.

8. A printing plate having an image which is prepared by exposing the image formation layer of the printing plate material of claim 1 to laser light.

* * * * *